United States Patent [19]
Chou et al.

[11] Patent Number: 5,778,336
[45] Date of Patent: Jul. 7, 1998

[54] SPEECH CODING AND JOINT DATA/ CHANNEL BIAS ESTIMATION USING FINITE STATE VECTOR QUANTIZER DERIVED FROM SEQUENTIAL CONSTRAINTS

[75] Inventors: Wu Chou, Berkeley Heights; Nambirajan Seshadri, Chatham, both of N.J.

[73] Assignee: Lucent Technologies Inc., Murray Hill, N.J.

[21] Appl. No.: 722,416

[22] Filed: Oct. 1, 1996

[51] Int. Cl.⁶ .............................. G10L 3/02; G10L 5/06
[52] U.S. Cl. ........................ 704/222; 704/230; 704/245
[58] Field of Search ................................ 704/222, 230, 704/245

[56] References Cited

U.S. PATENT DOCUMENTS 5,664,059  9/1997  Zhao ............................................. 704/254

OTHER PUBLICATIONS

Yunxin Zhao, "A New Speaker Adaptation Technique Using Very Short Calibration Speech", Proc. IEEE ICASSP 93, vol. II, pp. 562–565, Apr. 1993.

Yunxin Zhao, "An Acoustic–Phonetic–Based Speaker Adaptation Technique for Improving Speaker–Independent Continuous Speech Recognition," IEEE Trans. Speech and Audio Processing, vol. 2, No. 3, pp. 380–394, Jul. 1994.

Yunxin Zhao, "Iterative Self–Learning Speaker and Channel Adaptation Under Various Initial Condition," Proc. IEEE ICASSP 95, pp. 712–715, May 1995.

Wu Chou, Nambirajan Seshadri, and Mazin Rahim, "Trellis Encoded Vector Quantization for Robust Speech Recognition", Proceesings of the Fourth International Conference on Spoken Language Processing (ICSLP 96), pp. 2001–2004, Oct. 1996.

Primary Examiner—David R. Hudspeth
Assistant Examiner—Tálivaldis Ivars Šmits

[57] ABSTRACT

A joint data (features) and channel (bias) estimation framework for robust processing of speech received over a channel is described. A trellis encoded vector quantizer is used as a pre-processor to estimate the channel bias using blind maximum likelihood sequence estimation. Sequential constraint in the feature vector sequence of a speech signal is applied for the selection of the quantized signal constellation and for the decoding process in joint data and channel estimation. A two state trellis encoded vector quantizer is designed for signal bias removal applications.

28 Claims, 4 Drawing Sheets

SPEECH CODING AND JOINT DATA/CHANNEL BIAS ESTIMATION USING FINITE STATE VECTOR QUANTIZER DERIVED FROM SEQUENTIAL CONSTRAINTS

FIELD OF THE INVENTION

This invention is related to the field of speech signal processing and more particularly to a method and means for signal bias removal using coding derived from sequential constraints inherent in a speech signal.

BACKGROUND OF THE INVENTION

In many speech processing applications, particularly those of speech recognition and speech enhancement, the speech signal to be processed is presented at the output of a transmission channel (including a wireless channel) and will have been degraded due to environmental and channel distortion—e.g., introduction of ambient noise and variations in channel conditions. It is therefore an objective of such speech processing to recover as nearly as possible the original speech signal, either to improve intelligibility of the signal (as in speech enhancement) or for comparison with pre-stored speech signal data (as in speech recognition). Various approaches have been proposed to minimize the adverse effects of acoustic mismatch, such as may be caused by environmental and channel distortion, that is encountered between speech signals received over such a channel and the original speech data (or training speech data, as appropriate). Signal bias removal (SBR) is a commonly used signal conditioning method for robust speech processing, where channel distortion is modeled in the cepstrum domain by an additive bias term $\bar{b}$—see, e.g., Rahim, M. and Juang, B-H. "Signal Bias Removal for Robust Telephone Speech Recognition in Adverse Environments," *Proc. ICASSP'94* (1994). With SBR, the acoustic space corresponding to the matched channel condition is characterized by a set of Gaussians centered at the clusters $\mu_i$. The received cepstrum vector sequence, $\bar{y}$, is used to estimate the bias term $\bar{b}$, according to a maximum likelihood formulation.

In a typical SBR application, vector quantization (VQ) is applied for quantizing and coding the spectral processes characterizing a speech signal. It is known that the centroids, $\mu_i$, in such an SBR application are based on a memoryless VQ clustering in the cepstral domain—i.e., the current search is independent of past decisions. In contrast, the feature vector sequence from speech is not a memoryless process and often obeys some intrinsic sequential constraint.

To a point, the sequential constraints inherent in speech are addressed by a modification of SBR known as hierarchical signal bias removal (HSBR), a method which has previously been suggested by the inventors and others (see, Rahim, M., Juang, B-H. Chou, W. and Buhrke, E., "Signal Conditioning Techniques for Robust Speech Recognition," *IEEE Signal Processing Letters* and Chou, W., Rahim, M., and Buhrke, E., "Signal Conditioned Minimum Error Rate Training", *Proc. Eurospeech'95*, pp. 495–498). In HSBR, the centroids, $\mu_i$, are generated from the Gaussian pdf mean vectors of Hidden Markov Models (HMMs). Although, in HSBR, the sequential constraint in the feature vector sequence is implicitly carried over to the generation of the centroids $\mu_i$, the decoding process, where the bias vector $\bar{b}$ is estimated, assumes that the feature vector sequence is memoryless.

SUMMARY OF THE INVENTION

Accordingly, it is an object of the invention to provide a method for bias removal from a speech signal which utilizes coding provided by sequential constraints inherent in such a speech signal. To that end, a coded modulation approach to robust speech processing is provided for application to a signal bias removal process. Specifically, a system and method are provided for conditioning a received speech signal to compensate that speech signal for unknown distortion components included therein, where the conditioning is related to a coding of the speech signal based on sequential constraints characterizing the speech signal, the method comprising the steps of:

(1) selecting a model or set of models to describe acoustic events of human speech;

(2) decomposing the model into a plurality of acoustic classes, such classes reflecting a general correspondence with the sequential constraints;

(3) determining a set of centroids for clusters of training speech feature vectors included in each of the decomposed acoustic classes;

(4) operating on the speech feature vector centroids in each of the decomposed acoustic classes with a vector quantizer to determine at least one code word corresponding to each of the decomposed acoustic class;

(5) constructing a finite state vector quantizer based on the code words so determined;

(6) using the finite state vector quantizer to decode speech feature vectors of the received speech signal, thereby determining which portions of the speech signal correspond to each of the code words and, correspondingly, to each of the decomposed acoustic classes, the decoded speech feature vectors collectively comprising a minimum sequence distortion path in the finite state vector quantizer;

estimating a bias term in the received signal along that minimum sequence distortion path; and subtracting the estimated bias term from the received speech signal.

DETAILED DESCRIPTION

For clarity of explanation, the illustrative embodiment of the present invention is presented as comprising individual functional blocks. The functions these blocks represent may be provided through the use of either shared or dedicated hardware, including, but not limited to, hardware capable of executing software.

In a communication system, data transmission is often modeled by a dispersive channel with additive noise.

Assuming for the moment that the channel is invariant, the received signal $y_k$ has the form $$y_k = \sum_{i=0}^{L} x_{k-i} h_i + n_k \quad (1)$$

where $h_i$ is the channel impulse response and $n_k$ is the additive noise. The goal of signal conditioning or equalization is to determine the data sequence from the received signal sequence. Given a received sequence $\bar{y}=(y_1, Y_2, \ldots, Y_N)$, the maximum likelihood sequence estimator (MLSE) chooses the data sequence $$\hat{x} = \operatorname*{argmax}_{\{\bar{x} | \bar{x} = (x_1, \ldots, x_N)\}} P(\bar{y}|\bar{x}) \quad (2)$$

where $\bar{x}=(x_1, x_2, \ldots, x_N)$ ranges over all possible data sequences of length N and $P(\bar{y}|\bar{x})$ is the conditional probability of observing the received signal sequence $\bar{y}$ conditioned on the transmitted input sequence $\bar{x}$. In order to perform maximum likelihood sequence estimation, information about the channel is often required. For certain applications, a short training sequence (learning signal) is available, and the channel can be estimated by maximum likelihood channel estimation. Once the channel is estimated, the maximum likelihood sequence estimator can be applied to recover the data from the received signal. If the channel itself is assumed to be changing, the past decoded data can be used to track the channel variations using stochastic-gradient approximation to least mean squares procedures.

However, in many cases, neither the channel nor the data is known, and there is no short learning signal sequence which can be used for a direct channel estimation. Estimating the data sequence from the received signal without knowing the transmission channel is referred to as the problem of blind sequence estimation. One of the statistical frameworks for such blind sequence estimation is that of joint data and channel estimation (see, e.g., Seshadri, N., "Joint Data and Channel Estimation Using Blind Trellis Search Techniques", *IEEE Trans. on Communications*, Vol. 42, No.2/3/4, pp. 52–59). Under the joint data and channel estimation framework, the blind sequence estimation is based on the joint maximum likelihood estimate of both the data sequence and the channel $$(\bar{x}^*, \bar{h}^*) = \operatorname*{argmax}_{\bar{x}, \bar{h}} p(\bar{y}|\bar{x}, \bar{h}) \quad (3)$$

where the maximization is taken over all the equi-probable data sequences of length N and $\bar{h}$ is taken over all possible channel responses. For the additive white Gaussian noise channel, the joint data and channel estimation is obtained by the joint least square minimization $$(\bar{x}^*, \bar{h}^*) = \operatorname*{argmin}_{\bar{x}, \bar{h}} \sum_k \left| y_k - \sum_j x_{k-j} h_j \right|^2. \quad (4)$$

In practice, an optimum solution to a joint data and channel estimation is possible only when both the data symbol set and the number of possible channel responses $\bar{h}$ are small. A number of sub-optimal algorithms have been proposed to solve the joint data and channel estimation problem. One often used such algorithm is the segmental K-means algorithm that produces an estimate of the data using the Viterbi algorithm when conditioned on an initial estimate of the channel. The channel is then re-estimated using the decoded sequence. In order to bring down the complexity in joint data and channel estimation, the signal space is typically vector quantized and the channel responses are limited to the N most likely channel responses.

Signal bias removal for speech processing can be characterized in terms of joint data and channel estimation. The basic model in signal bias removal (SBR) is that the channel and the ambient noise introduce an unknown additive bias term in the cepstrum domain. The received signal is conditioned (i.e., processed to recover the original data) by subtracting the estimated bias term $\bar{b}$ from the received data. In this approach, neither the bias (channel plus ambient noise) nor the data (speech input $\bar{x}$) is known. In order to solve this joint data and channel estimation problem, the signal space represented by the cepstrum feature vectors in matched channel conditions is quantized and characterized by a set of Gaussians centered at the clusters $\{\mu_i\}$, following a process of memoryless VQ clustering of the cepstrum feature vectors. The bias term $\bar{b}$ (channel) is estimated through a two-step iterative procedure described below.

1. An estimate of the bias, $\bar{b}$, is computed for each utterance of T frames, such that $$\bar{b} = \frac{1}{T} \sum_{t=1}^{T} (y_t - \mu_{i^*}), \quad (5)$$

where $\mu_i^*$ is the "nearest neighbor", according to some distance criterion, to the distorted signal spectrum $y_t$:

$$i^* = \operatorname{arg\,min}_i \|y_t, \mu_i\|. \quad (6)$$

2. The estimated bias, $\bar{b}$, is subtracted from the distorted signal $$\bar{x}_t = y_t - \bar{b}\, 1 \leq t \leq T, \quad (7)$$

It will be recognized by those skilled in the art that this procedure is the practical segmental K-means approach to joint data and channel estimation in blind sequence estimation for signal bias removal.

I. Description of Methodology of Invention

It is well known that the sound transition in speech is continuously evolving—i.e., successive portions of the speech waveform are interdependent. The phenomenon of coarticulation in human speech is a resultant of the fact that the human articulator takes in-between positions during transitions from one sound to another. Thus, speech signals present an inherent contradiction of one of the tenets of the previously described prior-art SBR approach—that of the centroids $\{\mu_i\}$ in the SBR approach being based on a memoryless VQ clustering in the cepstral domain. Due to the coarticulation phenomenon in speech, it can readily be seen that the feature vector sequence from speech is not a memoryless process and often obeys some intrinsic sequential constraint. Thus, it is apparent that the intrinsic sequential constraint of speech should be addressed in speech processing.

Considering specifically the matter of signal conditioning or bias removal for a speech signal, one of the important issues of using the quantized approach in joint data and channel estimation is the selection of the quantized signal cluster constellation. In data communication (i.e., non-voiced communication), the data sequence goes through channel coding, typically through a convolutional encoder, which imposes a very strong sequential constraint in the transmitted data sequence. Utilizing the sequential constraint in the transmitted data sequence is essential to improve the performance of the signal recovery in a noisy environment. The gain obtained from selecting an appropriate code constellation is called "coding gain", which is the reduction in probability of error compared to the use of an uncoded memoryless VQ processing methodology.

One way to achieve "coding gain" for speech communications is to treat the problem of vector quantizing the speech signal space as a problem of finding a good code constellation in which a certain sequential constraint is embedded in the transmitted data sequence. In accordance with the method of the invention, such a code constellation and its embedded sequential constraint can be specified by a finite state vector quantizer (FSVQ)—in particular, a trellis encoded vector quantizer. The quantized signal clusters are the code words on the arcs of such an FSVQ. An important advantage of the use of a trellis encoded vector quantizer is that this methodology permits a search of several vectors into the future when finding a minimum distortion path to determine the quantized value of the current received signal. This is, of course, very different from a memoryless VQ where the quantization process assumes independence of each sample and accordingly does not look into the trend of the future and past samples. As a consequence, a sequential constraint (such as in a speech signal) in a received signal sequence will not be explored.

Methods for designing a trellis encoded vector quantizer are well known and need not be further pursued here. For background in such design methods, the reader is referred to the following references: Seshadri, N., "Joint Data and Channel Estimation Using Blind Trellis Search Techniques", *IEEE Trans. on Communications*, Vol. 42, No.2/3/4, pp. 1000–1011; February–April 1994 Juang, B.-H., "Design and Performance of Trellis Vector Quantizers for Speech Signals", *IEEE Trans. on ASSP*, Vol 36, No. 9, Sep. 1988, pp. 549–552; Gersho, A. and Gray, R. M., "Vector Quantization and Signal Compression", Kluwer Academic Publishers, 1991.

It needs also to be noted that a speech feature vector sequence has no added sequential constraint from channel coding, because channel coding is not applied for a speech signal. Thus a problem is presented, and solved by the methodology of the invention, to find a trellis encoded vector quantizer in which sequential constraint in the source signal (speech feature vector sequence) is properly embedded, and to thereby take advantage of the coding provided by that inherent sequential constraint.

A primary goal of using a trellis encoded vector quantizer in a speech signal bias removal application is that of incorporating certain sequential constraints in both the selection of the speech signal centroids $\{\mu_i\}$ and the decoding process where the bias $\bar{b}$ is estimated. And, unlike the case of data communication, the sequential constraint imposed on the speech feature vector sequence must be consistent with the speech generation process. Moreover, in many speech processing applications, particularly speech recognition, the speech generation process is characterized by the distribution and the structure of an acoustic model. This requires that a sequential constraint, if it is imposed, has to be consistent with the constraint specified in that acoustic model.

Figure 1:
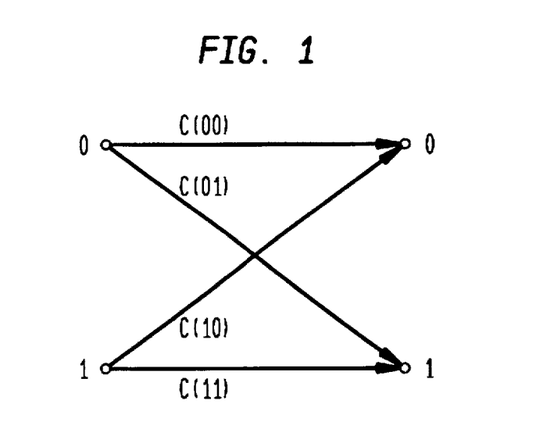
FIG. 1 depicts a two-state trellis encoded vector quantizer according to the method of the invention.

In a preferred embodiment of the methodology of the invention, the FSVQ used for decoding a speech signal based on sequential constraint in that signal is realized as a two state trellis encoded vector quantizer. The structure of this trellis encoded vector quantizer is illustrated in FIG. 1. As shown in the figure (which represents an illustrative embodiment of the invention), the code constellation consists of four code words (signal clusters) $\{C_{00}, C_{01}, C_{10}, C_{11}\}$. $C_{00}$ is generated by clustering all the mean vectors of Gaussian pdfs in the chosen set of speech models (which are HMMs in a preferred embodiment) for silence and background speech events; $C_{01}$ is generated by clustering all the mean vectors of Gaussian pdfs in the head state of the HMMs for keywords; $C_{10}$ is generated by clustering all mean vectors of Gaussian pdfs in the tail state of the HMMs for the keywords; and $C_{11}$ is generated by clustering all mean vectors of Gaussian pdfs in the HMMs for all keywords. The code generation process for this FSVQ code constellation is described in more detail in the nest section.

The two state trellis encoded vector quantizer described for the illustrative embodiment of the invention is a 1-bit quantizer. As will be understood, the transition between codewords bears no direct relationship with the closeness of the corresponding codewords. Such a code constellation design in consistent with the sequential constraint imposed by the acoustic modeling. In fact, the sequential constraint of the feature vector sequence is embedded in the transition between codewords.

According to the methodology of the invention, a received speech signal is decoded by the FSVQ and signal bias is estimated by a Viterbi search through the trellis determined by that decoding. The optimal path with minimum sequence distortion through the trellis encoded vector quantizer is specified by $$\bar{s}^* = \operatorname*{argmax}_{\{s|s=(s_1,s_2,\ldots,s_T)\}} \sum_{k=1}^{T} \|y_k - \alpha(y_k,s_k)\| \tag{8}$$

$$= \operatorname*{argmax}_{\{s|s=(s_1,s_2,\ldots,s_T)\}} \sum_{k=1}^{T} \|y_k - \mu_k(y_k,s_k)\| \tag{9}$$

where $\bar{s}=(s_1,s_2,\ldots,s_T)$ is taken over all state sequences, and $\alpha(y_k,s_k)=\mu_k(y_k,s_k)$ is the encoding function in the trellis encoded vector quantizer. The bias term $\bar{b}$ is estimated by $$\bar{b}^* = \operatorname*{argmax}_{\bar{b}} \sum_{k=1}^{T} \|y_k - \mu_k(y_k,s_k^*) - \bar{b}\| \tag{10}$$

which is evaluated along the optimal path with minimum distortion $\bar{s}^*=(s_1^*,s_2^*,\ldots,s_T^*)$. Gaussian noise, this relationship reduces to $$\bar{b} = \frac{1}{T} \sum_{k=1}^{T} (y_k - \mu_k(y_k,s_k^*)) \tag{11}$$

which will be recognized as the original SBR formulation.

Multiple signal cluster dependent biases $\{\bar{b}_i\}$ also be estimated, that relationship being given by $$\bar{b}_i = \frac{1}{T_i} \Sigma(y_{t_i} - \mu_i(y_{t_i},s_{t_i}^*))|_{\mu_i(y_{t_i},s_{t_i}^*)=C_i} \tag{12}$$

where $T_i$ is the number of received signal samples being mapped to $C_i$. Similarly to the HSBR methodology, these multiple biases can be integrated to form a time dependent bias. In fact, the time dependent bias $\bar{b}_t$ for each received signal can be based on the conditional expectation $$E(\bar{b}_t|y_t) = \sum_{j=1}^{M} \bar{b}_j \frac{f(y_t|Q(x_t) = C_j)P(Q(x_t) = C_j)}{\sum_{i=1}^{M} f(y_t|Q(x_t) = C_i)P(Q(x_t) = C_i)} \tag{13}$$

where $Q(x_t)$ is the quantization function in the signal space of matched conditions, and $\{C_i|i=1,\ldots,M\}$ is the signal cluster constellation. If the prior probability of the vector quantization $P(Q(x_t))$ is assumed to be uniform, equation (13) becomes $$E(\bar{b}_t|y_t) = \sum_{j=1}^{M} \bar{b}_j \frac{f(y_t|Q(x_t) = C_j)}{\sum_{i=1}^{M} f(y_t|Q(x_t) = C_i)} \quad (14)$$

The estimated input signal given the received signal $y_t$ is $$\bar{x}_t = E(x_t|y_t) = y_t - E(\bar{b}_t|y_t) \quad (15)$$

which is the optimal minimum mean square error bias compensation given the signal bias model $y_t = x_t + \bar{b}_t$.

II. System Implementation of Method of Invention

As explained in the previous section, a speech signal inherently includes sequential constraints in respect to transitions from one sound to another. While it is known that artificial sequential constraints are often added in data communication signals in order to provide a channel coding for error correction, articulation-based sequential constraints in human speech cannot be viewed as analogous to those channel-coding sequential constraints in data communications. The fact is: a speech signal is generated directly by the human articulator and there is no channel coding at all. Therefore, an objective of the invention is to use the sequential constraint inherent in speech to compensate a received speech signal and, in particular, to provide a better estimate of an unknown bias—such as caused by the noisy channel—in that signal. However, a key problem in such a speech signal compensation application is that the sequential constraint that the human articulator encodes in a speech signal is not known. With the method of the invention, that problem is solved by the use of the fact that the sequential constraint in human speech can be extracted from a model describing the acoustic events of human speech, such as the model, or a set of models, used for speech recognition or speech enhancement. This leads to the formulation of a methodology for applying such sequential constraints to the process of bias compensation in an input speech signal.

From a global perspective, the methodology of the invention can be viewed in terms of two key steps in that process:

(1) the generation of a finite state vector quantizer (which in a preferred embodiment is realized as a trellis encoded vector quantizer) that embeds the sequential constraint of human speech; and (2) application of that finite state vector quantizer to decode feature vectors of an input speech signal in relation to those sequential constraints, and to use such coding to provide an improved estimate of a distortion bias term in that speech signal.

Figure 2A:
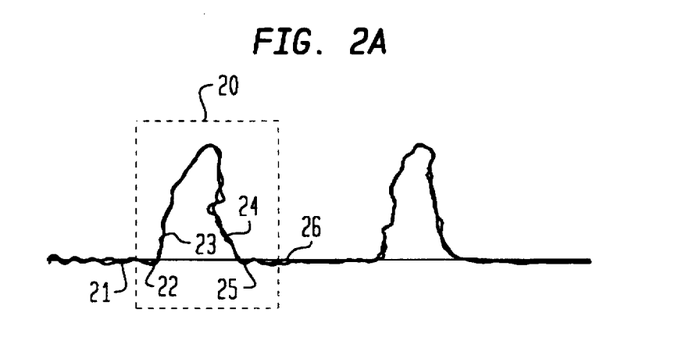
FIG. 2A provides an illustrative spectral representation of a brief portion of speech.
Figure 2B:
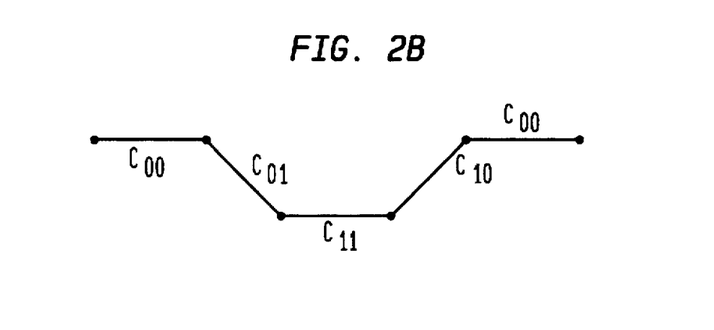
FIG. 2B provides a form of sequential constraint characterizing a portion of the speech waveform of FIG. 2A.

Implementation of the method of the invention will be better understood by reference to FIGS. 2-5 of the drawings. In FIG. 2A, an illustrative representation of a brief portion of speech is shown, and in FIG. 2B, a form of the sequential constraint for the portion of the speech waveform of FIG. 2A enclosed by the dashed rectangle 20 is indicated diagrammatically. As shown in FIG. 2B, the sequential constraint inherent in the selected speech portion can be represented by a set of four state transitions. The state transition $C_{00}$ can be seen as corresponding to the portion of the selected speech waveform of FIG. 2A from the left most portion of that selected waveform (indicated as 21) to a point just prior to the beginning of the substantial increase in the amplitude of the waveform, 22. The state transition $C_{01}$ corresponds to that portion of that selected waveform beginning just prior to the substantial amplitude increase 22 to a point shortly after the amplitude increase begins 23. Similarly, state transition $C_{11}$ corresponds to the portion of the waveform from shortly after the amplitude increase begins 23 to shortly before the amplitude increase ends 24. State transition $C_{10}$ represents the portion of the waveform from shortly before the amplitude increase ends 24 to shortly after the ending of that amplitude increase 25. Finally, state transition $C_{00}$ represents the portion of the waveform from a time shortly after the ending of that amplitude increase 25 to the right-most point of the selected waveform portion 26. Those four state transitions can be generalized to represent, respectively:

| | |
|---|---|
| $C_{00}$ | represents background speech events; |
| $C_{01}$ | represents the transition from a background speech event to the head portion of a key word speech event; |
| $C_{11}$ | represents the keyword speech event; and |
| $C_{10}$ | represents the transition from the tail portion of a keyword speech event to the beginning of a background speech event. |

It will be apparent to those skilled in the art that this representation of the sequential constraint inherent in human speech is illustrative but not exhaustive. It should also be apparent that the methodology of the invention is applicable to any such representation of those sequential constraints. Those skilled in the art will also readily recognize that the choice by the inventors of four state transitions as a preferred embodiment does not limit the applicability of the method of the invention to such an embodiment. There could well be a greater number of such state transitions defined, and/or each such state transition could include a plurality of sub-state transitions. For example, the background state transition, $C_{00}$, could readily include two (or more) sub-state transitions representing (1) complete silence and (2) random background noise.

It should at this point be seen that the sequential constraints represented by the state transitions $C_{00}$, $C_{01}$, $C_{11}$ and $C_{10}$ can readily be represented by the two-state trellis encoded vector quantizer depicted in FIG. 1, where the code constellation of the trellis consists of four code words corresponding to the four state transitions described above. The problem then is to find a set of code words for that trellis encoded vector quantizer which corresponds to the sequential constraints in human speech, and this is a problem which the inventors have solved.

That solution, and a key element of the invention, starts with the idea that the acoustic events of human speech are readily described by a set of models, such models being essential to various speech processing applications, such as speech recognition and speech enhancement. Very often such human speech acoustic events are modeled as Hidden Markov Models (HMMs) and such HMMs will be used to describe an illustrative embodiment of the invention. While such speech models are not per se able to identify sequential constraints in the modeled speech, it is possible, using known characteristics of human speech, to extract information about such sequential constraints from the model. One can therefore postulate a set of such acoustic classes which, in principle, characterize the sequential constraints in speech.

Figure 3:
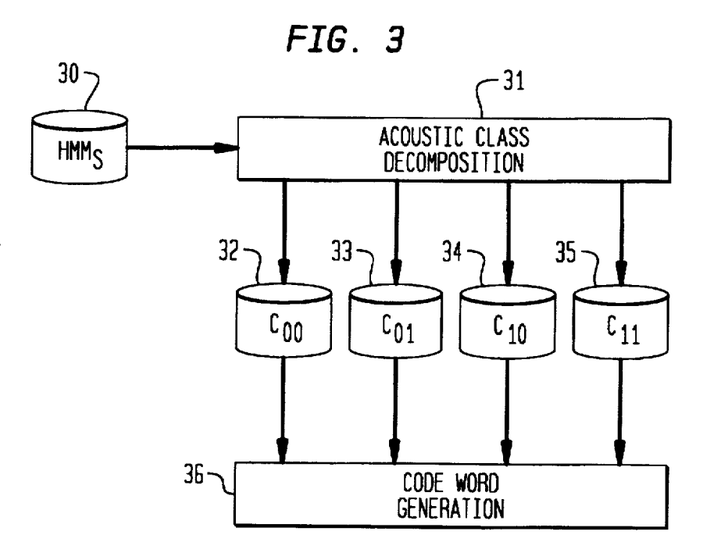
FIG. 3 illustrates a decomposition of a general speech model into a set of acoustic classes which are representative of sequential constraints inherent in a speech signal.

At this point, one can decompose the general speech model into a set of acoustic classes representing the sequential constraints in speech, as illustrated in FIG. 3. In that figure, the general model, represented by HMMs 30 is seen as being decomposed, by Acoustic Class Decomposition module 31, into a set of acoustic classes related to the sequential constraints in speech. In the embodiment illustrated in FIG. 3, four such classes are shown, 32, 33, 34 and 35, corresponding to the four state transitions illustrated in FIG. 2B, and labeled using the same notation as for those state transitions. Accordingly, acoustic class $C_{00}$ represents background speech events, class $C_{01}$ represents the transition from background to the head portion of a keyword speech event, class $C_{01}$ represents the transition from the tail portion of a key word speech event to background, and class $C_{11}$ represents key word speech events.

Using well known methods, the HMMs modeling the speech events can be trained using a corpus of training speech, to yield a cluster of speech feature vectors corresponding to each state of the model. Using similarly well known methods, a mean, or centroid can be determined for the speech vector clusters corresponding to each such model state. Thus, after decomposition of the model into the indicated acoustic classes, each such class will include the centroids for the vector clusters of each model state belonging to each such class. These centroids can then be quantized, using well known algorithms, by Code Word Generation module 36 of FIG. 3, to provide a set of code words representing those centroids.

In the illustrated embodiment, one code word per acoustic class is to be determined, so that all of the centroids for each such class will be quantized to a single code word for that class. It should be recognized, however, that multiple groupings of such centroids could as well be quantized into multiple code words for each class. For the preferred embodiment of the invention, quantization of the centroids to the code words is carried out by a vector quantization clustering, and the clustering algorithm is the well-known LBG algorithm [see, e.g., Gersho, A. and Gray, R. M., "Vector Quantization and Signal Compression", Kluwer Academic Publishers, 1991].

Once the quantization of the centroids for each of the four acoustic classes has been carried out, a set of four code words is available which embed the sequential constraint inherent in speech. These code words, which for convenience of reference may be labelled with the same $C_{00}$, $C_{01}$, $C_{11}$ and $C_{10}$ nomenclature used for the transition states and the decomposed acoustic classes, can then be used to construct the trellis encoded vector quantizer illustrated in FIG. 1, using known methods for such construction, where these code words form the code constellation for that trellis.

With the construction of the trellis encoded vector quantizer, the first of the two key steps, as heretofore described, for the methodology of the invention has been realized—to wit: the generation of a finite state vector quantizer (FSVQ) which embeds the sequential constraint of human speech. With such an FSVQ, the inventive methodology then proceeds to apply that FSVQ to the decoding of feature vectors of an input speech signal in relation to those embedded sequential constraints, and to use such coding to provide an improved estimate of a bias term in that speech signal.

Figure 4:
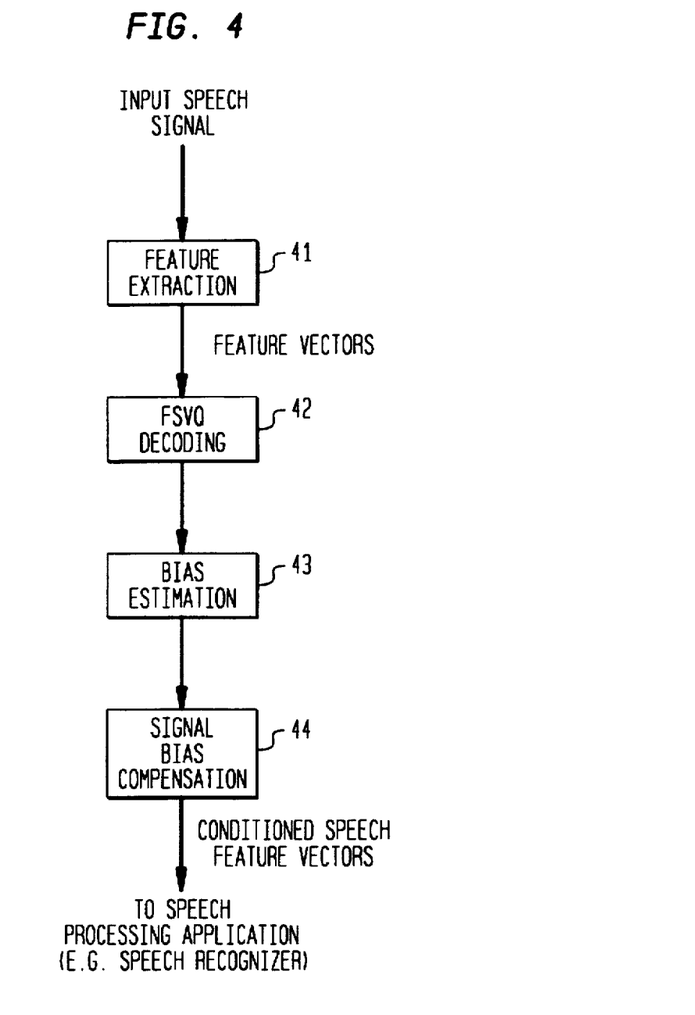
FIG. 4 illustrates the process according to the invention of bias estimation and removal using coding in a speech signal derived from inherent sequential constraints in such a speech signal.

That second key step process is depicted in FIG. 4. As shown in the figure, the process begins by operating on an input speech signal by Feature Extraction module 41 to provide a sequence of speech feature vectors representing that input speech signal. Such feature extraction is well known in the art. The sequence of feature vectors outputted from the feature extractor is then operated on by the FSVQ Decoding module 42, so as to determine which portion of the input speech signal corresponds to each of the code words, and thus to each of the decomposed acoustic classes (background, background to head portion of keyword, etc.), and accordingly to determine a minimum sequence distortion path through the FSVQ. That minimum sequence distortion path will be determined in accordance with Equation 9 of the prior section. An estimate is then made by Bias Estimation module 43 of an unknown bias in the input speech signal using Equation 10 in the prior section. That equation is evaluated along the minimum sequence distortion path determined by the FSVQ Decoding module. The speech vector sequence from the input speech signal is then compensated by Signal Bias Compensation module 44 to remove the estimated bias term from the input speech signal (Equation 15). The output of the signal bias compensation module thus provides a sequence of compensated speech feature vectors in the cepstrum domain which can be used as input to a speech processing application, such as a speech recognizer.

Figure 5:
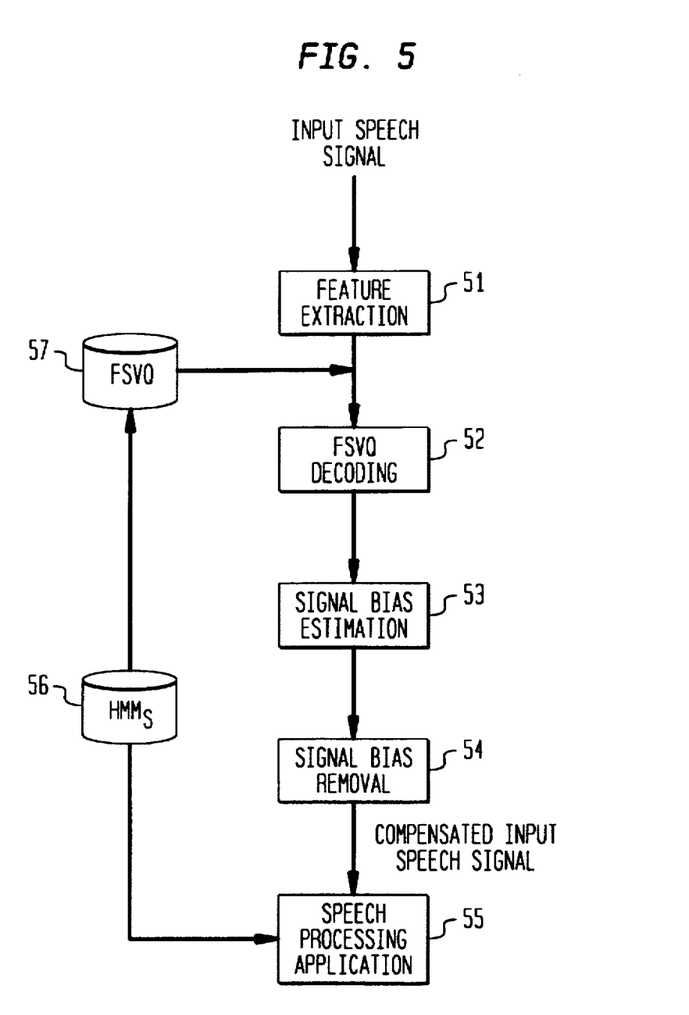
FIG. 5 provides a global view of the process of the invention.

A global view of the invention, incorporating the earlier described two key steps in the methodology of the invention, is provided in FIG. 5. As can be seen in that figure, the FSVQ 57, which operates, through FSVQ Decoding module 52 on feature vectors outputted from Feature Extraction module 51, is itself derived from a set of speech models designated as HMMs 56 (through code words determined from a decomposition of those models into a set of acoustic models related to sequential constraints in speech, as explained above). The decoded input speech vectors are then acted on by Signal Bias Estimation module 53 and Signal Bias Removal module 54, as explained in connection with FIG. 4, to provide a sequence of compensated input signal vectors. Those compensated vectors then provide an input to a Speech Processing Application 55, such as a speech recognizer. That Speech Processing Application, which ordinarily will itself be based on a set of models for describing the relevant acoustic events, will use the same set of speech models as formed the basis for determining the code words of the FSVQ.

III. Application of Methodology of Invention

It should be apparent that the methodology of the invention described hereinabove for recovery of an input speech signal from a received signal contaminated by channel distortion and ambient noise includes a variety of speech processing applications. Notable among such applications are speech recognition, particularly automatic speech recognition, and speech enhancement (i.e., improvement in intelligibility of a received speech signal). Moreover, while the method of the invention is likely to provide a relatively greater degree of improvement for communications transmitted over a wireless, or radio, channel, as compared to a wireline channel, (due to the generally higher noise or distortion characteristics of such wireless channels), it should be understood that this methodology is applicable to communications via any transmission medium, particularly where ambient noise is present at the source of such communications.

In a companion paper, the inventors discuss experimental results of applying the methodology of the invention and show this methodology to be advantageous when compared with the conventional memoryless VQ based approach in signal bias removal. See Chou, W., Seshadri, N., and Rahim, M., "Trellis Encoded Vector Quantization For Robust Speech Recognition", *In Preparation*. The inventors have also found that implementation of the methodology of the invention is straightforward, and that the CPU overhead for the inversive methodology is almost negligible, because the search trellis is extremely small.

IV. Conclusion

A novel joint data and channel estimation methodology has been disclosed having particular application to speech processing. A trellis encoded vector quantizer is used as a pre-processor to estimate the bias component of a received speech signal using blind maximum likelihood sequence estimation. In this approach, sequential constraint inherent in the speech feature vector sequence is applied to: a) the selection of the quantized signal constellation; and b) the decoding process in joint data and channel estimation. A two state trellis encoded vector quantizer is designed for signal bias removal applications.

Although the present embodiment of the invention has been described in detail, it should be understood that various changes, alterations and substitutions can be made therein without departing from the spirit and scope of the invention as defined by the appended claims.

We claim:

1. A method for conditioning a speech signal to compensate said signal for unknown distortion components included therein, wherein said conditioning is related to a coding of said signal based on sequential constraints characterizing said signal, said method comprising the steps of:

selecting a set of models for general acoustic modeling of human speech;

decomposing said model set into a plurality of acoustic classes, said classes reflecting a general correspondence with said sequential constraints;

determining a set of centroids for clusters of training speech feature vectors included in each said decomposed acoustic class;

operating on said speech feature vector centroids in each said decomposed acoustic class with a quantizing means to determine at least one code word corresponding to each said decomposed acoustic class;

constructing a finite state vector quantizer based on said code words so determined;

using said finite state vector quantizer to decode speech feature vectors of said signal, thereby determining which portions of said signal correspond to each of said code words, said decoded speech feature vectors collectively comprising a minimum sequence distortion path in said finite state vector quantizer;

estimating a bias term in said signal along said minimum sequence distortion path; and subtracting said estimated bias term from said signal.

2. The method for conditioning a speech signal of claim 1, wherein said quantizing means of said operating step is implemented as a vector quantizer.

3. The method for conditioning a speech signal of claim 1, wherein said finite state vector quantizer is realized as a trellis encoded vector quantizer.

4. The method for conditioning a speech signal of claim 1, wherein said plurality of acoustic classes comprise at least four such acoustic classes.

5. The method for conditioning a speech signal of claim 1, wherein said selected model set is of the class of Hidden Markov Models.

6. The method for conditioning a speech signal of claim 1, wherein an output of said subtracting step is provided to a speech processing application.

7. The method for conditioning a speech signal of claim 6, wherein said speech processing application is a speech recognizer.

8. The method for conditioning a speech signal of claim 6, wherein said speech processing application is a speech enhancer.

9. A method for providing a coding for a speech signal, wherein said coding embeds sequential constraints characterizing human speech comprising the steps of:

selecting a set of models for general acoustic modeling of human speech;

decomposing said model set into a plurality of acoustic classes, said classes reflecting a general correspondence with said sequential constraints;

determining a set of centroids for clusters of training speech feature vectors included in each said decomposed acoustic class; and operating on said speech feature vector centroids in each said decomposed acoustic class with a quantizing means to determine at least one code word corresponding to each said decomposed acoustic class.

10. The method for providing a coding for a speech signal of claim 9, wherein said quantizing means of said operating step is implemented as a vector quantizer.

11. The method for providing a coding for a speech signal of claim 9, wherein said code words determined in said operating step form a code-word constellation for a finite state vector quantizer.

12. The method for providing a coding for a speech signal of claim 11, wherein said finite state vector quantizer is realized as a trellis encoded vector quantizer.

13. The method for providing a coding for a speech signal of claim 9, wherein said plurality of acoustic classes comprise at least four such acoustic classes.

14. The method for providing a coding for a speech signal of claim 9, wherein said selected model set is of the class of Hidden Markov Models.

15. A method for reducing the effect of an unknown signal bias in an input speech signal, wherein a set of code words which embed sequential constraints inherent in said speech signal is generated, and further wherein said code word set is incorporated in a finite state vector quantizer as a code constellation thereof, said method comprising the steps of:

using said finite state vector quantizer to decode speech feature vectors of said speech signal, thereby determining which portions of said speech signal correspond to each of said code words, said decoded speech feature vectors collectively comprising a minimum sequence distortion path in said finite state vector quantizer;

estimating a bias term in said speech signal along said minimum sequence distortion path; and subtracting said estimated bias term from said speech signal.

16. The method for reducing the effect of an unknown signal bias of claim 15, wherein said finite state vector quantizer is realized as a trellis encoded vector quantizer.

17. The method for reducing the effect of an unknown signal bias of claim 15, wherein said set of code words comprises at least four such code words.

18. The method for reducing the effect of an unknown signal bias of claim 15, wherein an output of said subtracting step is provided to a speech processing application.

19. The method for reducing the effect of an unknown signal bias of claim 18, wherein said speech processing application is a speech recognizer.

20. The method for reducing the effect of an unknown signal bias of claim 18, wherein said speech processing application is a speech enhancer.

21. A system for reducing the effect of an unknown signal bias in an input speech signal, wherein said system operates on a coding of said signal based on sequential constraints characterizing said signal, said system comprising:

means for decomposing a selected set of models describing acoustic events of human speech into a plurality of acoustic classes, said classes reflecting a general correspondence with said sequential constraints;

a first processing means for determining a set of centroids for clusters of training speech feature vectors included in each said decomposed acoustic class;

a second processing means operating on said speech feature vector centroids in each said decomposed acoustic class to implement a quantizing process to thereby determine at least one code word corresponding to each said decomposed acoustic class;

a means for constructing a finite state vector quantizer based on said code words so determined;

a third processing means for causing said finite state vector quantizer to decode speech feature vectors of said signal, thereby determining which portions of said signal correspond to each of said code words, said decoded speech feature vectors collectively comprising a minimum sequence distortion path in said finite state vector quantizer;

a fourth processing means for estimating a bias term in said signal along said minimum sequence distortion path; and a fifth processing means for subtracting said estimated bias term from said signal;

and wherein one or more of said first through said fifth processing means may be combined into a common processing means.

22. The system for reducing the effect of an unknown signal bias in an input speech signal of claim 21, wherein said quantizing process carried out by said second processing means is implemented as a vector quantization process.

23. The system for reducing the effect of an unknown signal bias in an input speech signal of claim 21, wherein said finite state vector quantizer is realized as a trellis encoded vector quantizer.

24. The system for reducing the effect of an unknown signal bias in an input speech signal of claim 21, wherein said plurality of acoustic classes established by said means for decomposing comprise at least four such acoustic classes.

25. The system for reducing the effect of an unknown signal bias in an input speech signal of claim 21, wherein said selected model set is of the class of Hidden Markov Models.

26. The system for reducing the effect of an unknown signal bias in an input speech signal of claim 21, further including a speech recognizer means operating on an output signal from said fifth processing means.

27. The system for reducing the effect of an unknown signal bias in an input speech signal of claim 21, further including a speech enhancement means operating on an output signal from said fifth processing means.

28. In a method for processing a speech signal wherein a bias term representing unknown distortion in said signal is estimated and then subtracted from said signal, the improvement therein comprising the steps of:

determining a set of code words from a set of acoustic models of human speech which embed sequential constraints inherent in human speech;

constructing a finite state vector quantizer wherein said code word set comprises a code constellation for said finite state vector quantizer;

applying said finite state vector quantizer for decoding said signal; and estimating said bias term from data provided by said finite state vector quantizer decoding.

* * * * *